(12) United States Patent
Han

(10) Patent No.: US 6,888,767 B1
(45) Date of Patent: May 3, 2005

(54) DUAL POWER SENSING SCHEME FOR A MEMORY DEVICE

(75) Inventor: Jonghee Han, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/723,211

(22) Filed: Nov. 26, 2003

(51) Int. Cl.[7] .................................................. G11C 7/00
(52) U.S. Cl. ..................... 365/203; 365/204; 365/207; 365/226
(58) Field of Search ................................. 365/203, 207, 365/226, 206, 204

(56) References Cited

U.S. PATENT DOCUMENTS 6,011,738 A * 1/2000 Son et al. ................ 365/207
6,023,437 A * 2/2000 Lee ......................... 365/203

* cited by examiner

*Primary Examiner*—Son T. Dinh
(74) *Attorney, Agent, or Firm*—Moser, Patterson & Sheridan, L.L.P.

(57) ABSTRACT

Sensing operations involving a first array of bit line sense amplifiers (BLSAs) may be powered by an upper reference voltage and a first intermediate voltage and the first array may be precharged to a voltage level therebetween. Sensing operations involving a second array of BLSAs may be powered by a second intermediate voltage (greater than the first intermediate voltage) and a lower reference voltage and the second array may be precharged to a voltage level therebetween. After precharge, charge may be transferred from a second power line of the first array to a first power line of the second array. Subsequently, the second power line of the first array may be coupled to a power supply node at the first intermediate voltage level and the first power line of the second array may be coupled to a power supply node at the second intermediate voltage level.

20 Claims, 6 Drawing Sheets

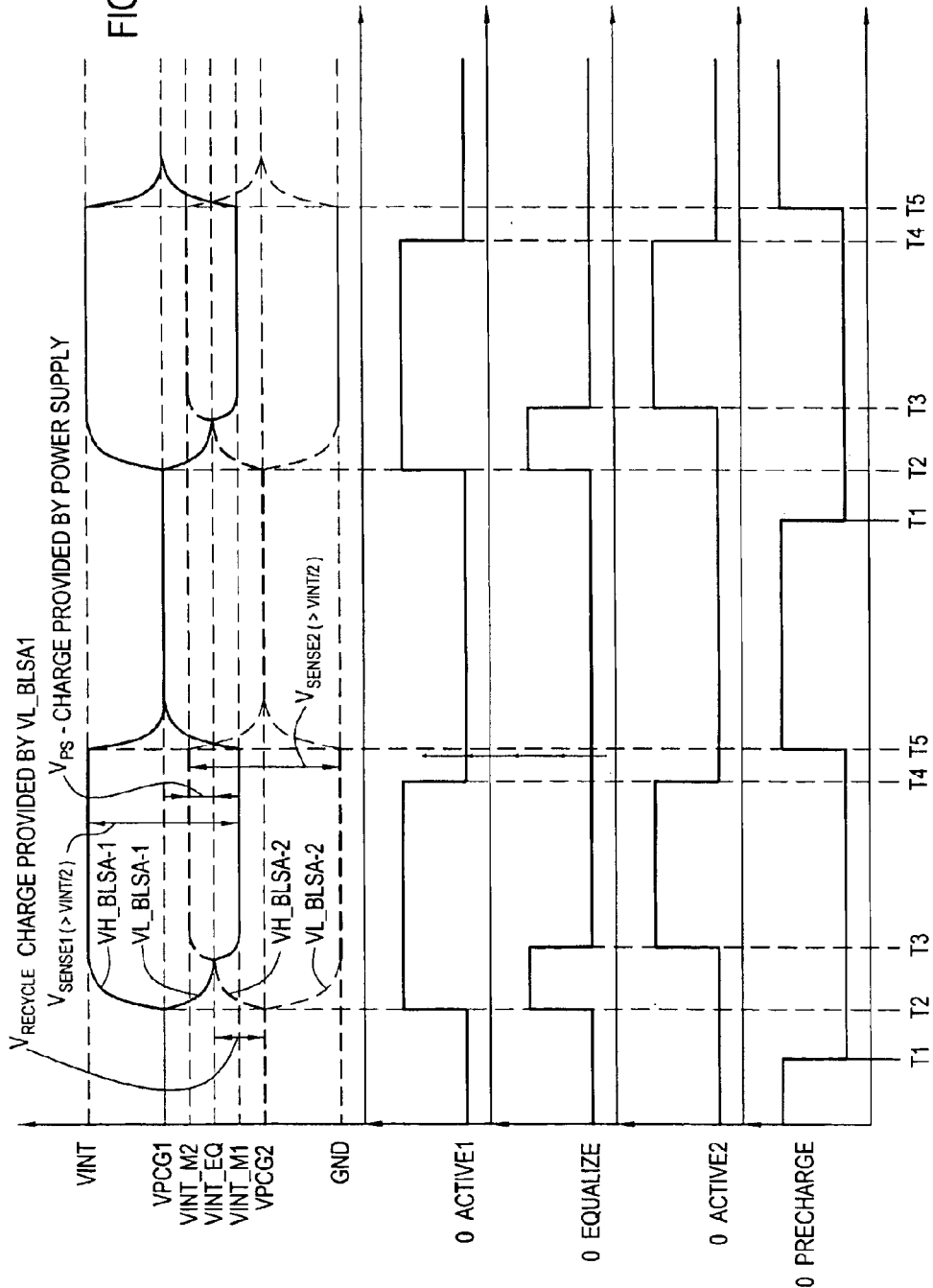

DUAL POWER SENSING SCHEME FOR A MEMORY DEVICE

BACKGROUND OF THE INVENTION

1. Field of the Invention

The present invention generally relates to integrated circuit devices and, more particularly, to memory devices that involve sensing operations, su ch as dynamic random access memory (DRAM) devices.

2. Description of the Related Art

The evolution of sub-micron CMOS technology has resulted in an increasing demand for dynamic random access memory (DRAM) devices. A DRAM device is generally a volatile memory device where each memory cell consists of one transistor and one capacitor. Such memory cells require periodic refreshing to protect the data stored in a memory cell from corruption or decaying over time. Refreshing is performed periodically (e.g., about every 64 msec), as well as when an information content of the memory cell is accessed, for example, during a read or write operation. Common to such routines is a sensing operation, during which a content of the memory cell is asserted and refreshed.

Therefore, the sensing operation is one of most power-consuming operations performed in the DRAM devices. In battery-powered computer systems (e.g., palm-top computers, hand-held electronic devices, and the like), minimization of power consumption is critically important. In advanced DRAM devices, during the sensing operation, about a half of the power that is used to refresh an array of the memory cells may partially be recycled for sensing memory cells in the other array. However, there are limitations to such recycling schemes, as described below in reference to FIGS. 1–3.

FIG. 1A depicts a block diagram of an exemplary DRAM device $100$. The DRAM device $100$ generally comprises control circuitry $102$ and a memory circuitry $104$. The control circuitry $102$ generally includes a logic circuit $105$ including various control circuitry such as command and address decoders, self refresh circuitry, and the like, as well as a sensing circuit $106$. The sensing circuit $106$ includes circuitry utilized to generate voltage signals used to access (e.g., sense) data stored in various memory cell arrays $138$.

Each memory cell array $138$ may have a corresponding array of bit line sense amplifiers (BLSAS) $140$, collectively forming a memory block $136$. In devices implementing BLSA power line charge recycling, BLSA arrays are divided into an "upper" group of BLSA arrays $140_U$ and a "lower" group of BLSA arrays $140_L$. As used herein, the term recycling generally refers to the utilization of charges supplied by the external power source $110$ to the upper group $140_U$ in sensing operations involving the lower group $140_L$. The power lines of the upper and lower groups are supplied with the voltage signals generated by the sensing circuit $106$, via a BLSA power bus $116$.

As illustrated in FIG. 1B, the upper and lower BLSA groups $140$ each utilize two power lines ($208$ and $210$) for sensing bit line pairs $202$ of memory cells $200$ of a corresponding array $138$ (VH_BLSA1/VL_BLSA$_1$ and VH_BLSA2N/L_BLSA2, respectively). Recycling typically occurs by transferring charge from the lower voltage line of the upper group (VL_BLSA1) to the higher voltage line of the lower group (VH_BLSA2). The concepts of charge recycling may be best described with reference to FIG. 2, which illustrates a conventional sensing circuit $106_2$.

As illustrated in FIG. 2, a bit line sensing controller $134_2$ may generate a set of signals $\Phi_{PRE\text{-}CHARGE}$ and $\Phi_{ACTIVE}$ to control the application of voltage signals applied to power lines of the upper and lower group BLSA arrays $140$, via a switch array $132_2$. The upper group $140_U$ utilizes an upper reference voltage $V_{INT}$ and an intermediate voltage $V_{INT\_M}$ to power the sensing operations, while the lower group $140_U$ utilizes $V_{INT\_M}$ and a lower reference voltage (e.g., GND in FIG. 2) to power the sensing operations. The voltage signals $V_{INT}$, $V_{INT\_M}$ (approx $V_{INT}/2$) and GND are generated by a voltage regulator $130_2$. FIG. 3 illustrates an exemplary timing diagram of the $\Phi_{PRE\_CHARGE}$ and $\Phi_{ACTIVE}$ signals for sensing operations performed by sensing circuit $106_2$.

As illustrated in FIG. 3, at a time T1, prior to sensing, the power lines of each group of BLSA arrays $140$ have been precharged (e.g., by equalizing each corresponding pair of power lines via switches $222_{PC}$ while the bit line sensing controller $134_2$ drives $\Phi_{PRE\_CHARGE}$ high). As illustrated, VH_BLSA1 and VL_BLSA1 are precharged to a first level VPCG1, while VH_BLSA2 and VL_BLSA2 have been precharged to VPCG2. Sensing operations begin at a time T2, when the sensing controller $134_2$ asserts $\Phi_{ACTIVE}$, causing switches $222U$ and $222L$ to close, coupling VH_BLSA1 to $V_{INT}$ and VL_BLSA2 to GND. As a result, VH_BLSA1 increases to $V_{INT}$, while VL_BLSA2 decreases to GND.

At the beginning of the sensing operations, the power lines VL BLSA1 and VH_BLSA2 are also coupled together, causing charge to be transferred from VL_BLSA1 to VH_BLSA2, as VL_BLSA1 decreases from VPCG1 to VINT_M causing a corresponding increase in VH_BLSA2 from VPCG2 to $V_{INT}$ M (this increase is denoted in FIG. 3 as $V_{REC}$). Thus, current consumption from the external power source $110$ is reduced, as charge used to precharge the upper group $140U$ is utilized in the sensing operations involving the lower group. At a time T3, the bit line sensing controller $134_2$ de-asserts $\Phi_{ACTIVE}$, signaling an end of the sensing operations, and decoupling the power lines from the internal power supply $130_2$. At a time T4, the power lines are again precharged, in preparation of the next sensing operation, by equalizing the power lines via switches $222_{PC}$.

Thus, during the sensing operation, the conventional sensing circuit $106_2$ may recycle approximately 50% of the power (or charge) used in the upper group for sensing by the lower group. To provide such recycling of the charge, the level of $V_{INT\_M}$ should be less than half the output voltage $V_{EXT}$ of the external power source $110$. Additionally, of course, the voltage differential between the power lines of the BLSA arrays $140$ must be sufficient to maintain full voltage logic levels on the sensed bit lines (which is based on switching transistor threshold voltages for particular device technologies). As external voltage levels continue to shrink, satisfying these requirements of $V_{INT\_M}$ may become more difficult.

Therefore, there is a need in the art for an improved sensing circuit configuration for use in memory devices, such as dynamic random access memory (DRAM) devices.

SUMMARY OF THE INVENTION

Embodiments of the present invention provide methods and circuit configurations for recycling charge from one array of bit line sense amplifiers for use in sensing operations involving a second array of bit line sense amplifiers.

One embodiment provides a method for recycling a charge in a memory device. The method generally includes precharging first and second power lines of a first array of bit line sense amplifiers to a first voltage level between an upper reference voltage level and a first intermediate voltage level, precharging first and second power lines of a second array of bit line sense amplifiers to a second voltage level between a second intermediate voltage level and a lower voltage reference, wherein the second intermediate voltage level is greater than the first intermediate voltage level, and momentarily coupling the first power line of the second array to the second power line of the first array to transfer charge therefrom.

Another embodiment provides a method for recycling charge. The method generally includes powering at least a portion of sensing operations of a first array of bit line sense operations with first and second power lines at an upper reference voltage level and a first intermediate voltage level, respectively, powering at least a portion of sensing operations of a second array of bit line sense operations with first and second power lines at a second intermediate voltage level and a lower reference voltage level, respectively, and during or prior to the sensing operations, transferring charge from the second power line of the first array to the first power line of the second array.

Another embodiment provides a method for recycling charge from one or more power lines of a first array of bit line sense amplifiers to one or more power lines of a second array of bit line sense amplifiers. The method generally includes momentarily closing a first one or more switches to precharge first and second power lines of the first array to a first voltage level between a first intermediate voltage level and an upper reference voltage level and to precharge first and second power lines of the second array to a second voltage level between a lower reference voltage level and a second intermediate voltage level, momentarily closing a second one or more switches to transfer charge from the second power line of the first array to the first power line of the second array, and momentarily closing a third one or more switches to couple the first power line of the second array to a power supply node at the second intermediate voltage level.

Another embodiment provides a circuit configuration for use in recycling bit line charges. The circuit configuration generally includes a first set of switches to selectively couple a first power line of a first array of bit line sense amplifiers to a power supply node at an upper reference voltage level and to selectively couple a second power line of a second array of bit line sense amplifiers to a power supply node at a lower reference voltage level, a second set of switches to selectively couple a second power line of the first array to a power supply node at a first intermediate voltage level and to selectively couple a first power line of the second array to a power supply node at a second intermediate voltage level higher than the first intermediate voltage level, a third set of switches to selectively precharge the first and second power lines of the first array to a first precharge voltage level and to selectively precharge the first and second power lines of the second array to a second precharge voltage level, and a fourth set of one or more switches to selectively couple the second power line of the first array to the first power line of the second array.

Another embodiment provides a memory device generally including at least first and second arrays of bit line sense amplifiers to sense bit lines of memory cells of the memory device, a voltage regulator with output nodes for at least an upper voltage reference, first and second intermediate voltages, and a lower voltage reference, and sensing control circuitry. The sensing control circuitry is generally configured to precharge first and second power lines of the first array to a first precharge level, precharge first and second power lines of the first array to a second precharge level, transfer charge from the second power line of the first array to the first line of the second array, couple the second power line of the first array to the first intermediate voltage output node, and couple the first power line of the second array to the second intermediate voltage output node.

BRIEF DESCRIPTION OF THE DRAWINGS

The teachings of the present invention can be readily understood by considering the following detailed description in conjunction with the accompanying drawings, in which:

FIG. 5 illustrates an exemplary timing diagram for sensing operations in accordance with embodiments of the present invention.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide methods and circuit configurations for the recycling of charge supplied to one group of bit line sense amplifiers (BLSAS) for use in sensing operations of another group of BLSAs. In general, each group of BLSAs utilizes a different pair of voltage signals to power their respective sensing operations. The first group of BLSAs may utilize an upper reference voltage and a first intermediate voltage to power its sensing operations, while the second group of BLSAs may utilize a second intermediate voltage and a lower reference voltage (e.g., GND). While the voltage differential of each pair of power lines may be greater than half the externally supplied voltage, each intermediate voltage may not. As a result, charge recycling may be accomplished over a wider range of externally supplied operating voltages.

AN EXEMPLARY CIRCUIT FOR DUAL POWER SENSING

Figure 1A:
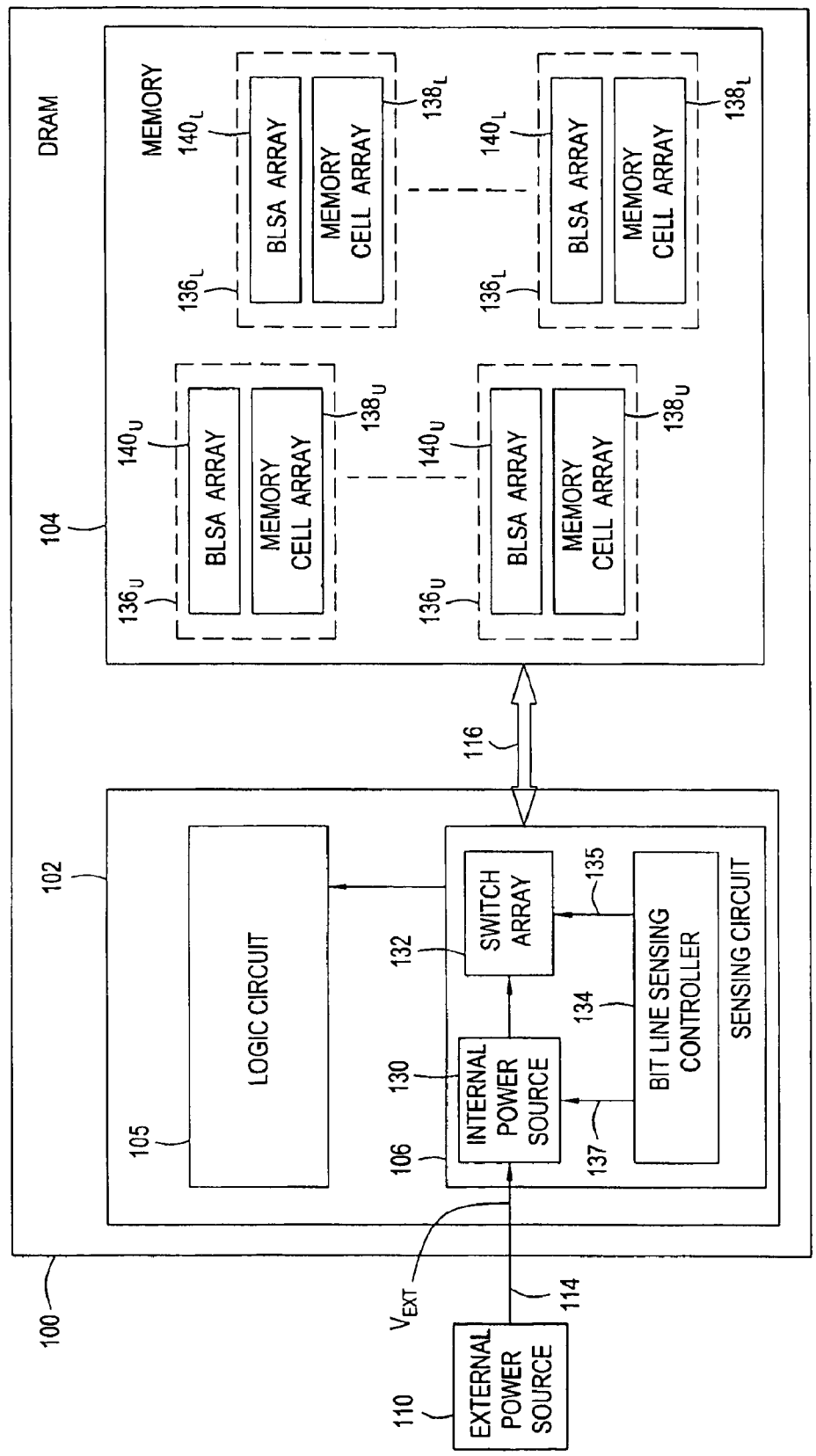
FIGS. 1A–1B illustrate an exemplary memory device in which embodiments of the present invention may be utilized.
Figure 1B:
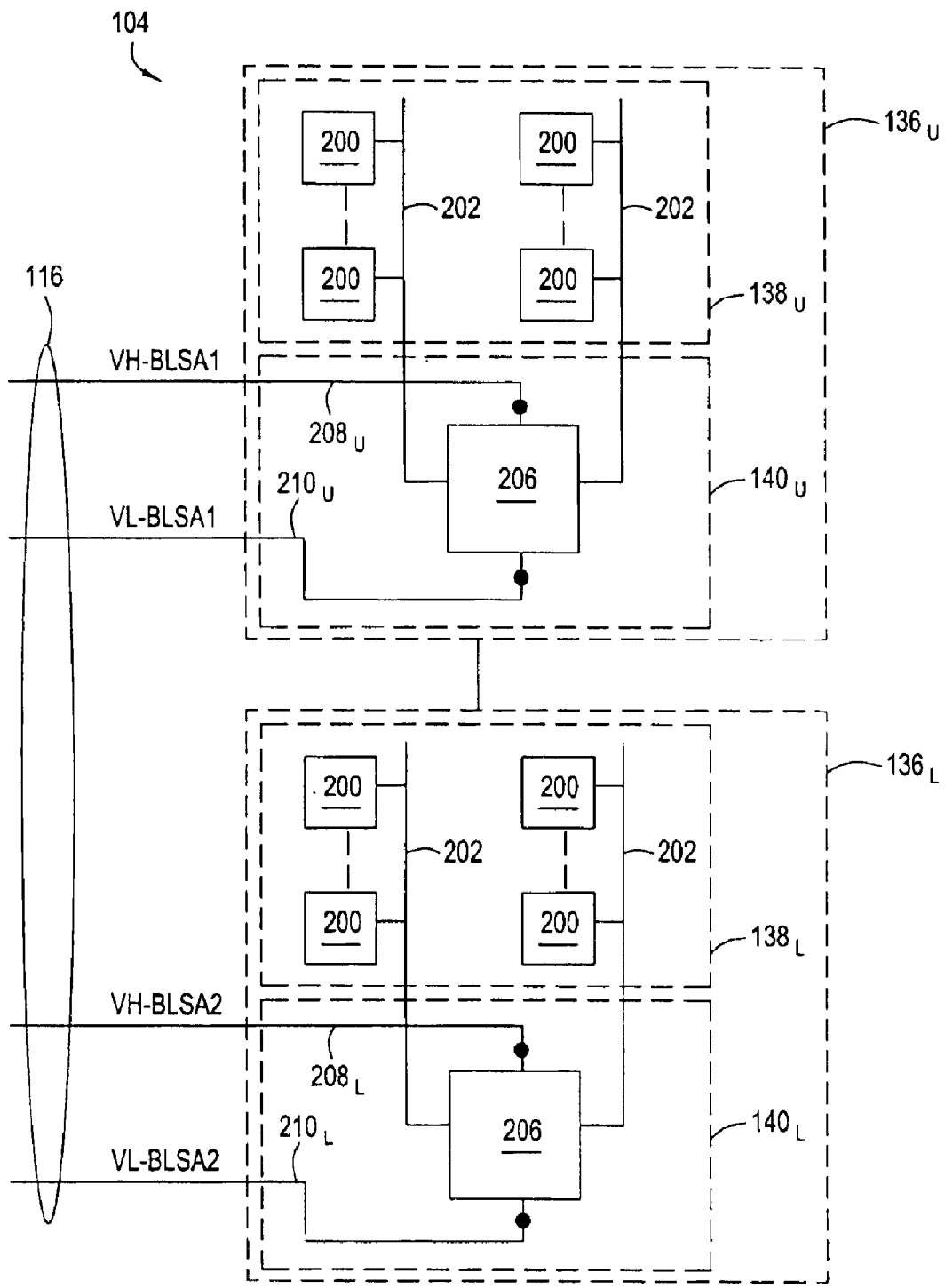
Figure 4:
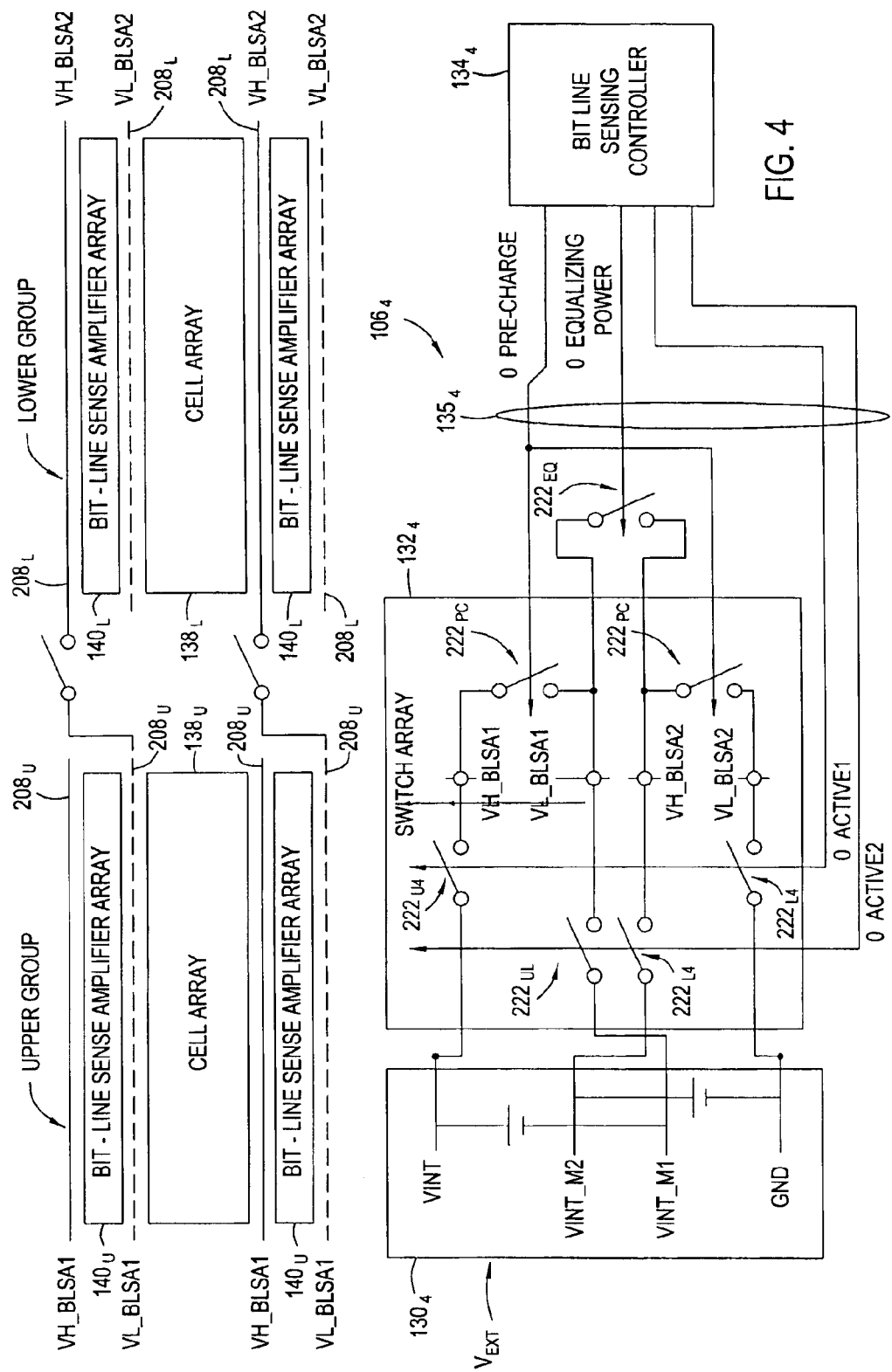
FIG. 4 illustrates an exemplary sensing circuit configuration in accordance with embodiments of the present invention.

FIG. 4 illustrates an exemplary sensing circuit $106_A$ utilizing a dual power sensing scheme, in accordance with one embodiment of the present invention, that may be utilized in a memory device, such as the DRAM device 100 illustrated in FIG. 1. As illustrated, the sensing circuit $106_A$ generally includes a dual power voltage regulator $130_A$, a switch array $132_A$, and a bit line sensing controller $134_A$. The bit line sensing controller $134_A$ is generally configured to control the switch array 132 (via control signals $135_A$), to supply voltage signals from the regulator $130_A$ to BLSA arrays 140 to sense cells of memory arrays 138. As previously described, the BLSA arrays 140 may be divided into upper and lower groups $140_U$ and $140_L$, respectively.

Figure 2:
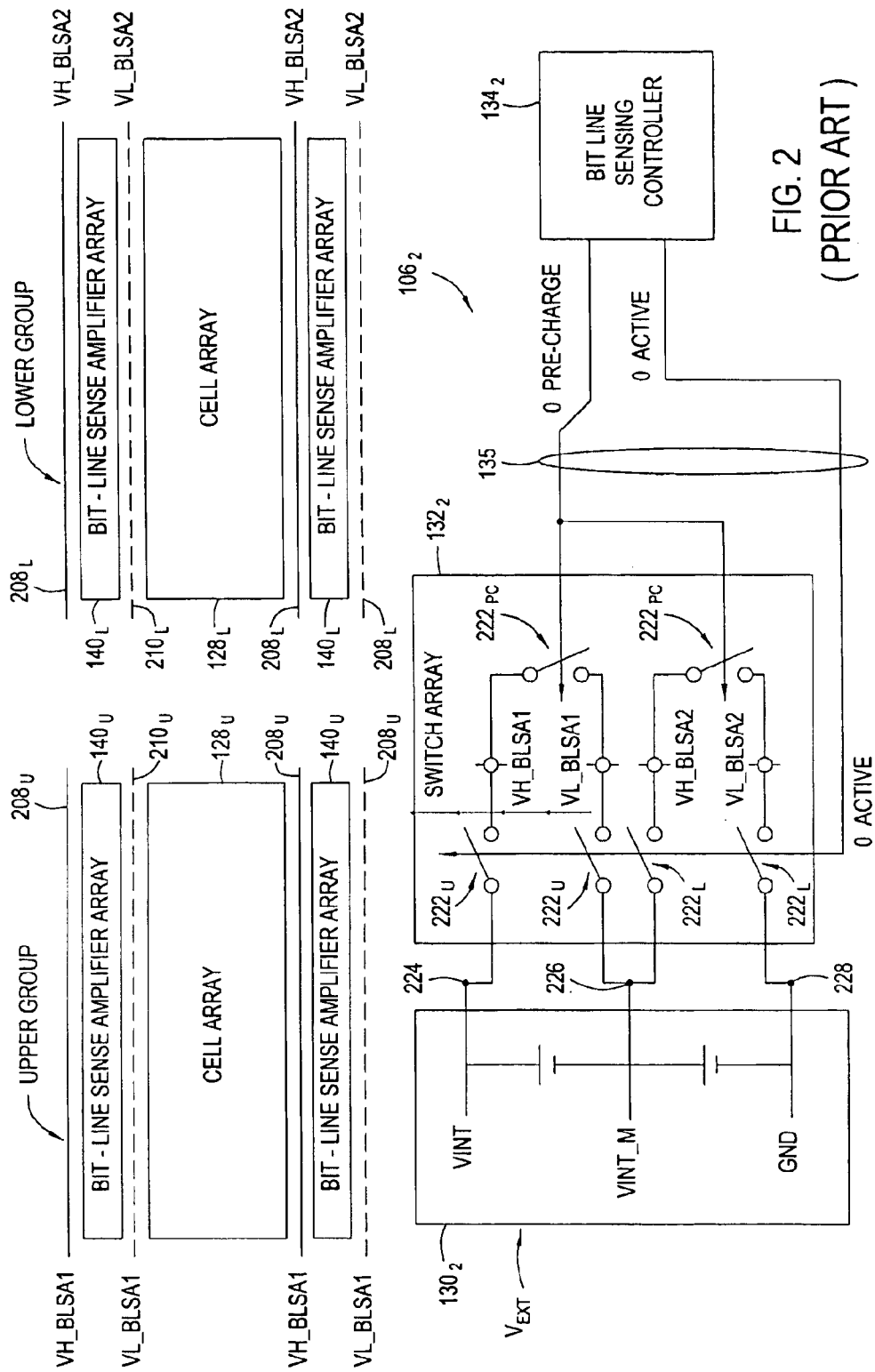
FIG. 2 illustrates an exemplary sensing circuit configuration in accordance with the prior art.
Figure 3:
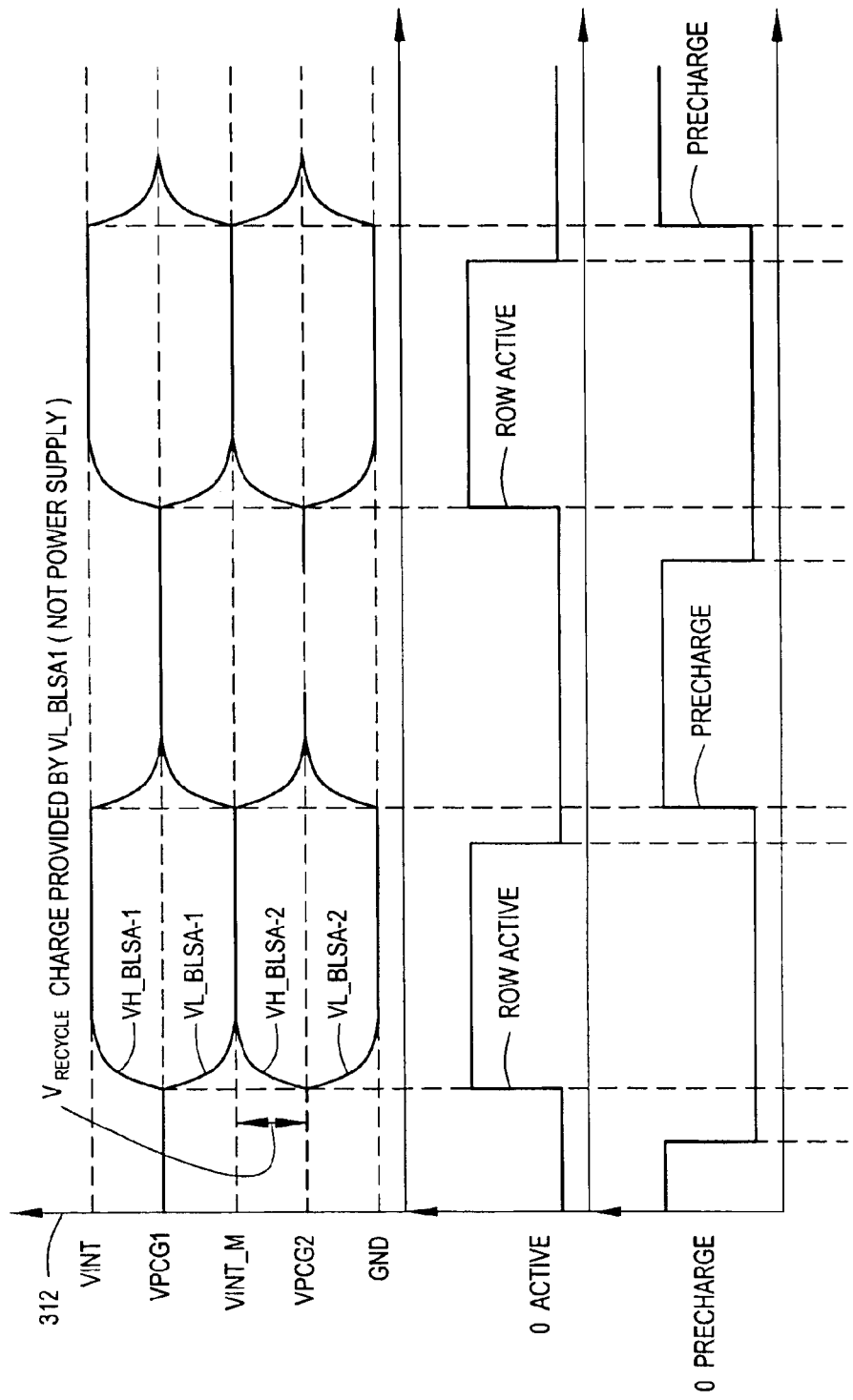
FIG. 3 illustrates an exemplary timing diagram for sensing operations in accordance with the prior art.

As illustrated, rather than supply a single intermediate voltage $V_{INTM}$, as with the conventional regulator $130_2$ shown in FIG. 2, the regulator $130_4$ may be configured to provide two intermediate output voltages, $V_{INT\_M1}$ and $V_{INT\_M2}$ for sensing operations involving the upper group $140_U$ and the lower group $140_L$, respectively. In other words, the upper group 140 $_U$ utilizes an upper reference voltage $(V_{INT})$ and $V_{INT\_M1}$ to power the sensing operations, while the lower group $140_U$ utilizes $V_{INT\_M2}$ and a lower reference voltage (e.g. GND) to power the sensing operations. Generally, $V_{INT\_M2}$ is greater than $V_{INT\_M1}$ and is typically greater than $V_{INT}/2$, while $V_{INT\_M1}$ is typically less than $V_{INT}/2$.

However, by using such offset intermediate voltages, the differential voltage of the voltage signals used by each group to power the sensing operations of each group is greater than $V_{INT}/2$ (e.g., $V_{INT}-V_{INT\_M1}$ and $V_{INT\_M2}$-GND), thus allowing sensing operations over a full range of logic high and low voltage levels. Of course, the ground reference (GND) may be a true ground or a reference voltage at any other level (negative or positive) below the first intermediate voltage level providing sufficient differential voltage for sensing operations involving the lower group of BLSA arrays $140_L$.

In the configuration of FIG. 4, in order to accomplish charge sharing using these dual intermediate voltage signals, the bit line sensing controller $134_4$ generates additional control signals, when compared to the bit line sensing controller bit line sensing controller $134_2$ of FIG. 2. For example, rather than generate a single $\Phi_{ACTIVE}$ signal, the bit line sensing controller $134_4$ generates two such signals, $\Phi_{ACTIVE1}$ and $\Phi ACTIVE_2$. As illustrated, $\Phi_{ACTIVE1}$ controls a set of switches that couple the high voltage power line of the upper group of BLSAs $140_U$ (VH_BLSA1) to $V_{INT}$, and the low voltage power line of the lower group of BLSAs $140_L$ (VL_BLSA2) to GND. As illustrated, $\Phi_{ACTIVE}$ controls a set of switches that couple the low voltage power line of the upper group of BLSAs $140_U$ (VL_BLSA1) to $V_{INT\_M1}$, and the high voltage power line of the lower group of BLSAs $140_L$ (VL_BLSA1) to $V_{INT\_M2}$.

The bit line sensing controller $134_4$ also generates a precharge signal $\Phi_{PRE\_CHARGE}$, which operates in a similar manner, as described above (e.g., to couple corresponding power lines of the upper and lower groups of BLSAs 140 to achieve a precharge voltage. However, as the lower voltage values have changed, the levels of the precharge voltages (VPCG1 and VPCG2), may change accordingly (e.g., VPCG1=approx. $(V_{INT}+V_{INT\_M1})/2$ and VPCG1=approx. $(V_{INT}+V_{INT\_M2})2$). Further, an additional control signal $\Phi_{EQUALIZE}$, allows equalization of VH_BLSA2 with VL_BLSA1, in order to enable charge recycling therefrom.

Operation of the sensing circuit $106_4$ may best be described with reference to FIG. 5, which illustrates an exemplary timing diagram of the control signals generated by the bit line sensing controller $134_4$. As illustrated, at a time T1, prior to sensing, the power lines of each group of BLSA arrays have been precharged (e.g., by equalizing each corresponding pair of power lines via switches $^{222}$ pc while the bit line sensing controller $134_2$ asserts $\Phi_{PRE\_CHARGE}$). As illustrated, VH_BLSA1 and VL_BLSA1 are precharged to a first level VPCG1, while VH_BLSA2 and VL_BLSA2 are precharged to VPCG2.

Sensing operations begin at a time T2, when the sensing controller $134_4$ drives $\Phi_{ACTIVE1}$ high, causing switches $222_{U\_H}$ and $222_{L\_L}$ to close, coupling VH_BLSA1 to $V_{INT}$ and VL_BLSA2 to GND, respectively. As a result, VH_BLSA1 increases to VINT, while VL_BLSA2 decreases to GND. Note that initially the sensing controller $134_4$ maintains $\Phi_{ACTIVE2}$ low. Thus, VL_BLSA1 and VH_BLSA2 are not connected to their respective intermediate voltages, $VINT_{\_M1}$ and $VINT_{\_M2}$.

Rather, the sensing controller $134_4$ asserts $\Phi_{EQUALIZE}$, coupling VL_BLSA1 and VH_BLSA2 via the equalizing switch $222_{EQ}$. As illustrated, this causes charge to be transferred (recycled) from VL_BLSA$_1$ to VH_BLSA2, as both lines equalize to a voltage level $V_{INT\_EQ}$ between $V_{INT\_M1}$ and $V_{INT}$ M2. At a time T3, the bit line sensing controller $134_4$ de-asserts $\Phi_{EQUALIZE}$, decoupling VL_BLSA1 and VH_BLSA2, and asserts $\Phi_{ACTIVE2}$, coupling VL_BLSA$_1$ and VH_BLSA2 to their respective supply voltages, $V_{INT\_M1}$ and $V_{INT\_M2}$, via switches $222_{U\_L}$ and $222_{L\_U}$. Thus, the external power supply provides the remaining charge to increase the level of VH_BLSA2 from $V_{INT}$ EO to $V_{INT\_M2}$.

At a time T4, the sensing controller $134_4$ de-asserts $\Phi_{ACTIVE1}$, and $\Phi_{ACTIVE2}$, signaling an end of the sensing operations, and decoupling the power lines from the internal power supply $130_4$. At a time T5, the power lines are again precharged, in preparation of the next sensing operation, for example, by asserting ΦPRE CHARGE to equalize the upper and lower group power line pairs via switches $222_{PC}$.

CONCLUSION

The present invention provides sensing control circuits that utilize a power supply with dual intermediate voltage levels to achieve adequate voltage differential for each group of BLSA arrays, while still allowing charge recycling. By utilizing overlapping power supplies, as described herein, charge recycling may be performed over a wider range of operating voltages, possibly extending the life of current device technologies as external supply voltages continue to fall.

While the foregoing is directed to the illustrative embodiment of the present invention, other and further embodiments of the invention may be devised without departing from the basic scope thereof, and the scope thereof is determined by the claims that follow.

What is claimed is:

1. A method for recycling a charge in a memory device, comprising:

precharging first and second power lines of a first array of bit line sense amplifiers to a first voltage level between an upper reference voltage level and a first intermediate voltage level;

precharging first and second power lines of a second array of bit line sense amplifiers to a second voltage level between a second intermediate voltage level and a lower voltage reference, wherein the second intermediate voltage level is greater than the first intermediate voltage level; and momentarily coupling the first power line of the second array to the second power line of the first array to transfer charge therefrom.

2. The method of claim 1, further comprising:

decoupling the first power line of the second array from the second power line of the first array;

coupling the second power line of the first array to a first supply line at the first intermediate voltage level; and coupling the first power line of the second array to a second supply line at the second intermediate voltage level.

3. The method of claim 2, further comprising, prior to decoupling the first power line of the second array from the second power line of the first array:
coupling the first power line of the first array to a supply line at the upper reference voltage level; and
coupling the second power line of the second array to a supply line at the lower reference voltage level.

4. The method of claim 1, wherein the voltage difference between the second intermediate voltage level and the lower reference voltage level is greater than half the voltage difference between the upper reference voltage level and the lower reference voltage level.

5. The method of claim 1, wherein the voltage difference between the upper reference voltage level and the first intermediate voltage level is greater than half the voltage difference between the upper reference voltage level and the lower reference voltage level.

6. A method for recycling charge comprising:
powering at least a portion of sensing operations of a first array of bit line sense operations with first and second power lines at an upper reference voltage level and a first intermediate voltage level, respectively;
powering at least a portion of sensing operations of a second array of bit line sense operations with first and second power lines at a second intermediate voltage level and a lower reference voltage level, respectively; and
during or prior to the sensing operations, transferring charge from the second power line of the first array to the first power line of the second array.

7. The method of claim 6, wherein transferring charge from the second power line of the first array to the first power line of the second array comprises momentarily closing a first switch to couple the second power line of the first array to the first power line of the second array.

8. The method of claim 7, further comprising:
opening the first switch to decouple the second power line of the first array to the first power line of the second array;
closing at least a second switch to couple the second power line of the first array to a power supply node at the first intermediate voltage level; and
closing at least a third switch to couple the first power line of the second array to a power supply node at the second intermediate voltage level.

9. The method of claim 6, wherein at least one of the first and second intermediate voltage levels is greater than one half the upper reference voltage level when measured from the lower reference voltage level.

10. A method for recycling charge from one or more power lines of a first array of bit line sense amplifiers to one or more power lines of a second array of bit line sense amplifiers, comprising:
momentarily closing a first one or more switches to precharge first and second power lines of the first array to a first voltage level between a first intermediate voltage level and an upper reference voltage level and to precharge first and second power lines of the second array to a second voltage level between a lower reference voltage level and a second intermediate voltage level;
momentarily closing a second one or more switches to transfer charge from the second power line of the first array to the first power line of the second array; and
momentarily closing a third one or more switches to couple the first power line of the second array to a power supply node at the second intermediate voltage level.

11. The method of claim 10, further comprising closing a fourth one or more switches to couple the second power line of the first array to a power supply node at the first intermediate voltage level.

12. The method of claim 10, wherein:
the second intermediate voltage level is greater than the first intermediate voltage level;
a voltage difference between the first intermediate voltage level and the upper reference voltage level is greater than half the voltage difference between the lower reference voltage and the upper reference voltage; and
a voltage difference between the second intermediate voltage level and the lower reference voltage level is greater than half the voltage difference between the lower reference voltage and the upper reference voltage.

13. A circuit configuration for use in recycling bit line charges comprising:
a first set of switches to selectively couple a first power line of a first array of bit line sense amplifiers to a power supply node at an upper reference voltage level and to selectively couple a second power line of a second array of bit line sense amplifiers to a power supply node at a lower reference voltage level;
a second set of switches to selectively couple a second power line of the first array to a power supply node at a first intermediate voltage level and to selectively couple a first power line of the second array to a power supply node at a second intermediate voltage level higher than the first intermediate voltage level;
a third set of switches to selectively precharge the first and second power lines of the first array to a first precharge voltage level and to selectively precharge the first and second power lines of the second array to a second precharge voltage level; and
a fourth set of one or more switches to selectively couple the second power line of the first array to the first power line of the second array.

14. The circuit configuration of claim 13, wherein the third set of switches comprises at least one switch to selectively couple the first and second power lines of the first array and at least one switch to selectively couple the first and second power lines of the second array.

15. A memory device comprising:
at least first and second arrays of bit line sense amplifiers to sense bit lines of memory cells of the memory device;
a voltage regulator with output nodes for at least an upper voltage reference, first and second intermediate voltages, and a lower voltage reference; and
sensing control circuitry configured to precharge first and second power lines of the first array to a first precharge level, precharge first and second power lines of the second array to a second precharge level, transfer charge from the second power line of the first array to the first line of the second array, couple the second power line of the first array to the first intermediate voltage output node, and couple the first power line of the second array to the second intermediate voltage output node.

16. The memory device of claim 15, wherein the control circuitry is further configured to, subsequent to precharging the first and second lines of the first and second arrays:
couple the first power line of the first array to the upper reference voltage output node; and
couple the second power line of the second array to the lower reference voltage output node.

17. The memory device of claim 15, wherein the controller is configured to precharge the first and second lines of the first array by momentarily coupling the first and second lines of the first array.

18. The memory device of claim 15, wherein the difference between the second intermediate voltage level and the lower reference voltage level is greater than one half the difference between upper reference voltage level and the lower reference voltage level.

19. The memory device of claim 15, wherein the difference between the first intermediate voltage level and the upper reference voltage level is greater than one half the difference between upper reference voltage level and the lower reference voltage level.

20. The memory device of claim 15, wherein the difference between the first intermediate voltage level and the upper reference voltage level is greater than one half the difference between a ground reference and a supply voltage of the memory device.

* * * * *

UNITED STATES PATENT AND TRADEMARK OFFICE
CERTIFICATE OF CORRECTION

PATENT NO. : 6,888,767 B1
DATED : May 3, 2005
INVENTOR(S) : Jonghee Han

It is certified that error appears in the above-identified patent and that said Letters Patent is hereby corrected as shown below:

Column 1,
Lines 61-62, replace "VH_BLSA1/VL_BLSA$_1$ and VH_BLSA2N/L_BLSA2" with
-- VH_BLSA1/VL_BLSA1 and VH_BLSA2/VL_BLSA2 --.

Column 2,
Line 28, replace "VL BLSA1" with -- VL_BLSA1 --.
Line 31, replace "VINT_M" with -- $V_{INT\_M}$ --.
Line 32, replace "$V_{INT}$ M" with -- $V_{INT\_M}$ --.

Column 4,
Line 41, replace "BLSAS" with -- BLSAs --.

Column 5,
Line 34, "ΦACTIVE$_2$" with -- $\Phi_{ACTIVE2}$ --.
Line 61, replace "switches $^{222}$" with -- switches 222 --.

Column 6,
Line 3, replace "VINT" with -- $V_{INT}$ --.
Line 7, replace "VINT—$_{M1}$ and VINT—$_{M2}$" with -- $V_{INT-M1}$ and $V_{INT\_M2}$ --.
Line 13, replace "VINT—$_{M1}$ and $V_{INT}$ M2" with -- $V_{INT-M2}$ --.
Line 26, replace "ΦPRE CHARGE" with -- $\Phi_{PRE\_CHARGE}$ --.

Signed and Sealed this

Twenty-seventh Day of September, 2005

JON W. DUDAS
*Director of the United States Patent and Trademark Office*